(12) United States Patent
Cranford, Jr. et al.

(10) Patent No.: US 7,721,134 B2
(45) Date of Patent: May 18, 2010

(54) METHOD FOR ON-CHIP DIAGNOSTIC TESTING AND CHECKING OF RECEIVER MARGINS

(75) Inventors: Hayden C. Cranford, Jr., Cary, NC (US); Daniel J. Friedman, Sleepy Hollow, NY (US); Mounir Meghelli, Tarrytown, NY (US); Thomas H. Toifl, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 663 days.

(21) Appl. No.: 11/566,576

(22) Filed: Dec. 4, 2006

(65) Prior Publication Data

US 2008/0133958 A1 Jun. 5, 2008

(51) Int. Cl.
*H04L 25/00* (2006.01)
*H03D 3/24* (2006.01)

(52) U.S. Cl. .................. 713/400; 713/401; 375/371; 375/373; 375/375; 375/376

(58) Field of Classification Search ......... 713/400–401; 714/700, 704, 706, 707; 375/371, 373, 375, 375/376
See application file for complete search history.

(56) References Cited

U.S. PATENT DOCUMENTS

| 5,233,628 | A | 8/1993 | Rappaport et al. |
| 5,862,177 | A | 1/1999 | Cummings et al. |
| 5,937,005 | A | 8/1999 | Obuchi et al. |
| 6,061,393 | A | 5/2000 | Tsui et al. |
| 6,178,213 | B1 * | 1/2001 | McCormack et al. ....... 375/355 |
| 6,996,202 | B2 * | 2/2006 | McCormack et al. ....... 375/355 |
| 7,529,329 | B2 * | 5/2009 | Popescu et al. ............. 375/354 |
| 2006/0034394 | A1 * | 2/2006 | Popescu et al. ............. 375/326 |

* cited by examiner

*Primary Examiner*—Abdelmoniem Elamin
(74) *Attorney, Agent, or Firm*—Dillon & Yudell LLP (57) ABSTRACT

A method and system for determining the eye pattern margin parameters of a receiver system during diagnostic testing is presented. The circuitry in the receiver's front end comprises a series of latches, XOR gates and OR gates which first provide the data samples and edge samples, i.e., data sampled at the rising or falling edge of an (edge) clock characterized by a phase delay relative to the data sampling clock. The receiver also comprises optimization circuitry for the ideal alignment of the edge clock (edges) with the data edges. The method further provides for a phase shifting of the edge clock to the left and right from the ideal/locked position to screen the data eye pattern in order to compute the Bit Error Rate (BER) value. The position of the edge clock relative to the data sampling clock determines the horizontal eye opening for the computed BER.

20 Claims, 7 Drawing Sheets

METHOD FOR ON-CHIP DIAGNOSTIC TESTING AND CHECKING OF RECEIVER MARGINS

BACKGROUND OF THE INVENTION

1. Technical Field

The present invention generally relates to electronic circuits and in particular to receivers for data communication systems. Still more particularly, the present invention relates to the on-chip diagnostic of receiver systems while operating in functional mode.

2. Description of the Related Art

High bandwidth chip-to-chip interconnection is a crucial part of many of today's digital communication systems. High speed input/output (I/Os) are extensively used in server processors, memory to central processing unit (CPU) interfaces, multiprocessor systems, and gaming applications. These I/Os which are part of the physical layer of a data communication system are designed to operate at a given Bit Error Rate (BER) with some predefined margins. These predefined margins are the vertical and horizontal eye openings of the received data as seen by the decision circuit of the receiver at the given BER. The margin is usually verified by mathematically modeling a link or by experimentation in the laboratory. Taking into account all the variability of all the link components, i.e. the electronic circuits, the transmission medium, external perturbation and other distortion and attenuation factors, the process of verifying the margins becomes very difficult and tedious.

The vertical eye opening is readily measured on-chip by utilizing an additional decision circuit having a pre-defined input voltage offset that matches the needed margin. The result of the decision circuit is then compared to that of the circuit processing the functional data. The additional cost of such an-chip diagnostic is minimal. However, checking the horizontal eye opening on-chip is difficult and usually incurs a penalty in power consumption and increased on-chip real estate. This difficulty and corresponding penalty is especially evident for receiver systems that use two (2) samples per symbol (known as 2× over sampling receivers) of the received data to extract the timing information and sample the data.

SUMMARY OF THE INVENTION

Disclosed is a method and system for determining the margin parameters of a receiver system during diagnostic self checking and during real time and/or live data detection. The circuitry in the receiver's front end comprises a series of latches, XOR gates and OR gates, which first provide the data samples and edge samples, i.e., data sampled at the rising or falling edge of an (edge) clock (Eck) characterized by a phase delay relative to the data sampling clock (DCk). The receiver circuitry processes the data and edge samples according to Boolean logic to obtain the "UP" and "DN" signals used to adjust the phase delay of the edge clock such that the edges of the edge clock coincide with the data edges. This alignment of the edge clock (edges) with the data edges indicates the locked state. The phase relation between DCk and ECk is set in such a way that the edges of the data sampling clock are aligned in the middle of the data symbols. The method further provides for a phase shifting (relative to the DCk) of the edge clock to the left and right from the locked position in order to screen the data eye diagram. This edge clock adjustment (right and left) about the eye diagram is executed while maintaining the DCk sampling in the middle of the data symbols and with no phase corrections applied to DCk while the ECk is screening the eye diagram. During the eye screening process, the edge clock data sample is compared to the DCk data sample (the error free functional data). Consequently, the method provides for the computation of a Bit Error Rate (BER) value, in which the position of the edge clock relative to the DCk determines the horizontal eye opening (or margin) for the computed BER.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a method and system for determining the margin parameters of a receiver system during diagnostic self checking and during real time and/or live data detection. The circuitry in the receiver's front end comprises a series of latches, XOR gates and OR gates, which first provide the data samples and edge samples, i.e., data sampled at the rising or falling edge of an (edge) clock (Eck) characterized by a phase delay relative to the data sampling clock (DCk). The receiver circuitry processes the data and edge samples according to Boolean logic to obtain the "UP" and "DN" signals used to adjust the phase delay of the edge clock such that the edges of the edge clock coincide with the data edges. This alignment of the edge clock (edges) with the data edges indicates the locked state. The phase relation between DCk and ECk is set in such a way that the edges of the data sampling clock are aligned in the middle of the data symbols and with no phase corrections applied to DCk while the ECk is screening the eye diagram.

The method further provides for a phase shifting (relative to the DCk) of the edge clock to the left and right from the locked position in order to screen the data eye diagram. This edge clock adjustment (right and left) about the eye diagram is executed while maintaining the DCk sampling in the middle of the data symbols. During the eye screening process, the edge clock data sample is compared to the DCk data sample (the error free functional data). Consequently, the method provides for the computation of a Bit Error Rate (BER) value, in which the position of the edge clock relative to the DCk determines the horizontal eye opening (or margin) for the computed BER.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s). Where a later figure utilizes the element in a different context or with different functionality, the element is provided a different leading numeral representative of the figure number (e.g, 4xx for FIG. 4 and 5xx for FIG. 5). The specific numerals assigned to the elements are provided solely to aid in the description and not meant to imply any limitations (structural or functional) on the invention.

It is also understood that the use of specific parameter names are for example only and not meant to imply any limitations on the invention. The invention may thus be implemented with different nomenclature/terminology utilized to describe the above parameters, without limitation. Also, to differentiate among similar circuit components, the terms first and second and primary and secondary are utilized within the description and claims. The use of these terms is not meant to imply any hierarchical distinctions (numerical or other wise) on the specific component(s), and the terms are provided solely for clarity in describing the various similar components.

Figure 1A:
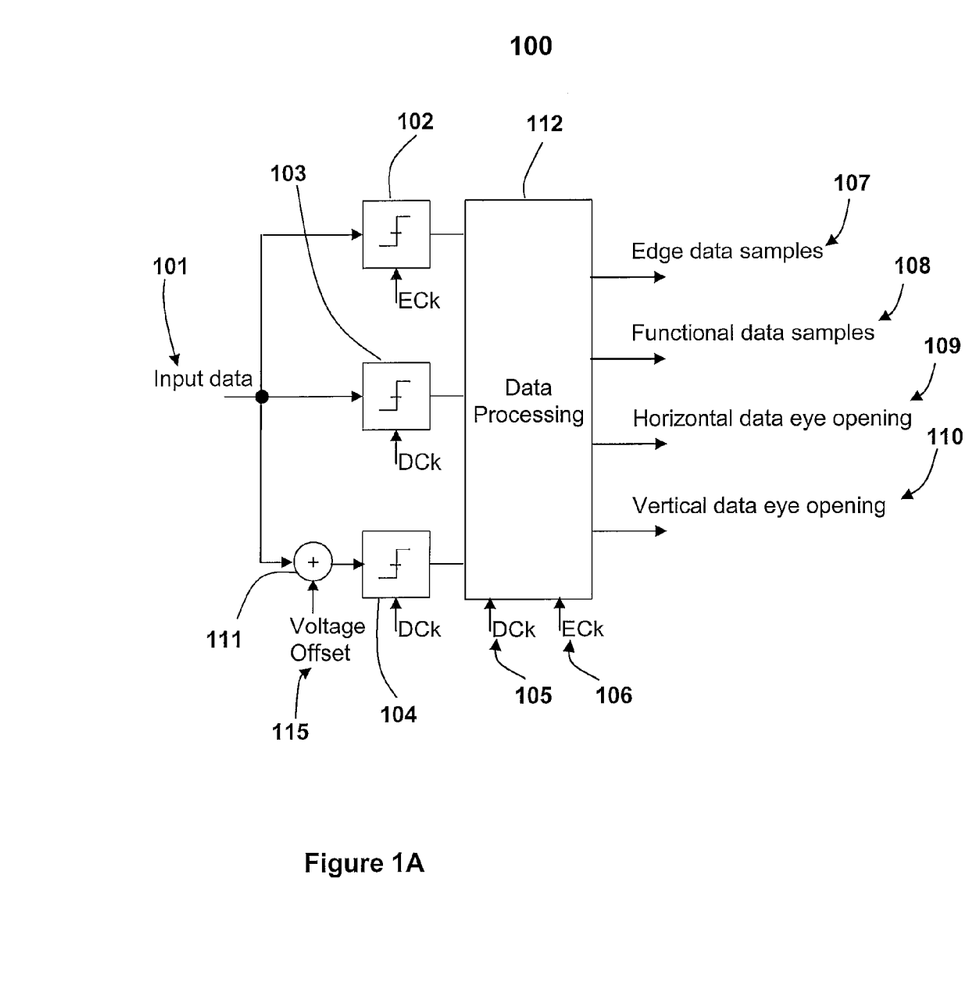
FIG. 1A illustrates a block diagram of a receiver system used in a communication system, within which features of the invention may be advantageously implemented.

With reference now to the figures, FIG. 1A illustrates a block diagram of a receiver, within which features of the invention may be implemented. Receiver 100 comprises an input port which receives (Input) Data 101, decision device 102, decision device 103, decision device 104, data sampling clock (DCk) 105 and Edge Sampling Clock (ECk) 106. Also included in Receiver 100 is data processing block 112. Receiver 100 generates a set of outputs from data processing block 112 which outputs comprise edge data samples 107, (functional) data samples 108, horizontal eye parameter 109 and vertical eye parameter 110.

In Receiver 100, Data 101 is received at the input port and routed along three input channels towards data processing block 112. At the first input channel, Data 101 encounters decision device 102 which is triggered by ECk 106. At the second input channel, Data 101 encounters decision device 103 which is triggered by DCk 105. The third input channel receives Data 101 at one input port of adder 111. At Adder 111, Data 101 is added to voltage offset 115. Voltage offset 115 is a value used to match the needed margin while checking for vertical eye parameter 110. The output of adder 111 encounters decision device 104 which is triggered by DCk 105. The decisions/outputs from each of the above decision devices are then received by data processing block 112. Data processing block 112 then generates outputs on individual output paths. These outputs comprise edge data samples 107, (functional) data samples 108, horizontal eye parameter 109 and vertical eye parameter 110.

A decision device (also referred to as a slicer) provides an estimate of a received symbol sequence. In the simplest case, the estimate is based on decision threshold levels. In the case of non-ideal channels, more advanced methods for making the decisions are needed to achieve optimal performance.

Figure 1B:
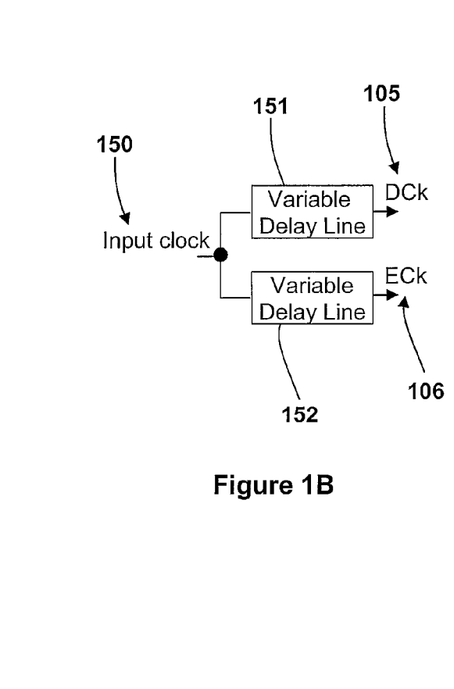
FIG. 1B is a block diagram illustrating the generation of clocks which are utilized in the receiver system of FIG. 1A.

FIG. 1B illustrates the generation of DCk 105 and ECk 106 which are both utilized in Receiver 100. Input clock 150 is delayed by variable delay circuit 151 to generate DCk 105. Similarly, a delay by variable delay circuit 152 generates ECk 106. Variable delay circuit 151 and variable delay circuit 152 have independently programmed delays.

In receiver 100, vertical eye (margin) parameter 110 is readily measured on-chip using, for example, decision device 104 having a pre-defined input voltage offset that matches the needed margin. The result of decision device 104 is then compared to the result of the decision device which processes the functional data. However, measuring horizontal eye parameter 109 on-chip is usually a difficult task which incurs a penalty in power consumption and increased on-chip real estate, especially for receiver systems which use two (2) samples per symbol (known as 2× over sampling receivers) of the received data to extract the timing information and sample the data. These systems usually align one phase of the local clock with the received data edges (i.e., aligned with ECk 106, for example) and use the second phase of the clock to sample the data (i.e., sampled with DCk 105, for example). The invention provides a modification (FIG. 3A) in the way the data is processed in receiver 100 to efficiently enable such an on-chip diagnostic feature.

Figure 2A:
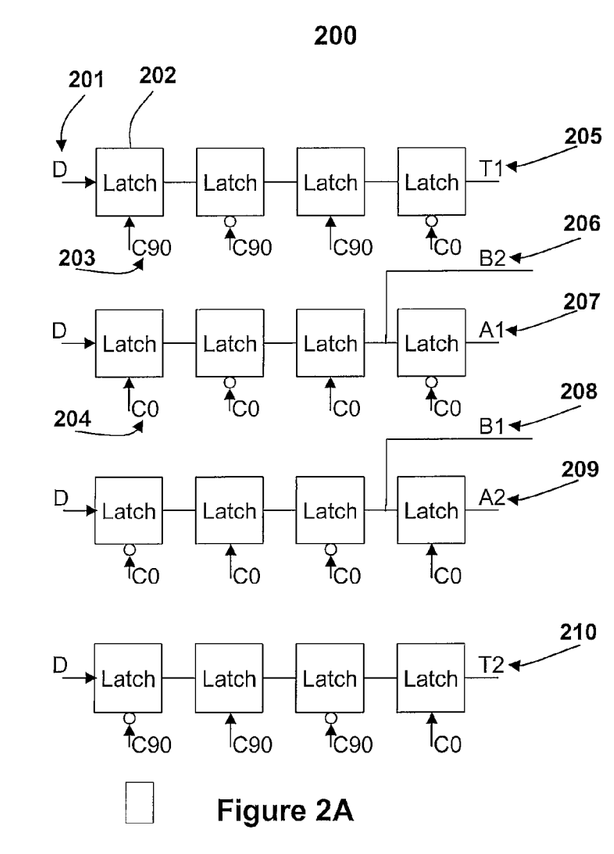
FIG. 2A illustrates a block diagram of a (classical) half-rate clock receiver front end, within which features of the invention may be advantageously implemented.

Referring now to FIG. 2A, an implementation of a (classical) half-rate clock receiver front end is illustrated. Receiver front end 200 comprises a number of input ports which (input) data sequence 201 is received, first latch 202, and a series of other sequentially connected latches, which may be similar or identical to first latch 202. Receiver front end 200 also comprises ECk (C90) 203, and DCk (C0) 204, which trigger the operation of the latches. Additionally, Receiver front end 200 generates the following data signals: a set of data sequences which include data sequence (A1) 207, data sequence (A2) 209, data sequence (B1) 208, and data sequence (B2) 206. Receiver front end 200 also generates a set of edge sequences which include edge sequence (T1) 205, and edge sequence (T2) 210.

In Receiver front end 200, the sampling clock frequency of DCk 204 and ECk 203 is equal to half the symbol rate of data sequence 201. In Receiver front end 200, the clock delays or phase shifts (illustrated in FIG. 1B) leads to a nominal phase difference of 90° between DCk 204 and ECK 203. Thus, DCk 204 is also referred to as C0 and ECk 203 is also referred to as C90. Throughout the description of the invention, reference will be made primarily to C0 and C90 to match the figures, and those references are understood to be interchangeable with DCk 204 and ECk 203, respectively.

Figures 2B, 2C:
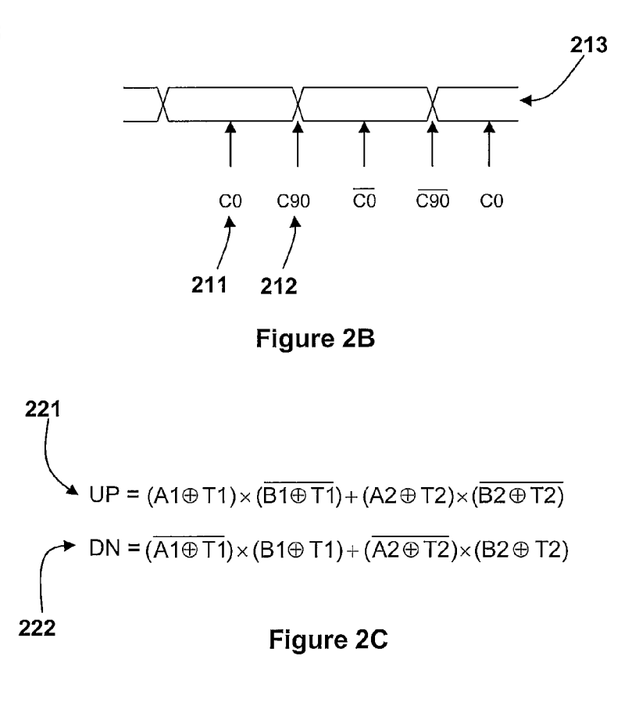
FIG. 2B illustrates the relative phase placement of the edge clock to the data sampling clock and the alignment of these clocks with a data sequence, according to an illustrated embodiment.
FIG. 2C shows the "UP" and "DN" equations, which are implemented in the receiver circuitry and used to optimally adjust the phase placement of clocks, according to a described embodiment.

Receiver front end 200 is connected to logic circuitry (shown in FIG. 2D) which processes the data and edge samples according to Boolean logic to obtain "UP" signal 221 and "DN" signal 222 (illustrated in FIG. 2C). These UP and DN signals are used, usually after some filtering has been applied to them, to optimally adjust the phase delay of the edge clock (C90), such that the edges of C90 coincide with the data edges. This alignment of the C90 edges with the data edges indicates the locked position/state. As a result of the relative placement between C0 and C90, the edges of the C0 clock are aligned in the middle of the data symbols.

FIG. 2B illustrates the relative phase placement of C90 to C0 and the alignment of these clocks with data symbols/sequence 213. In FIG. 2B, (the edges of) C0 is aligned in the middle of data symbols 213 and (the edges of) C90 is aligned with the edges of data symbols 213.

Figures 3A, 3B, 3C:
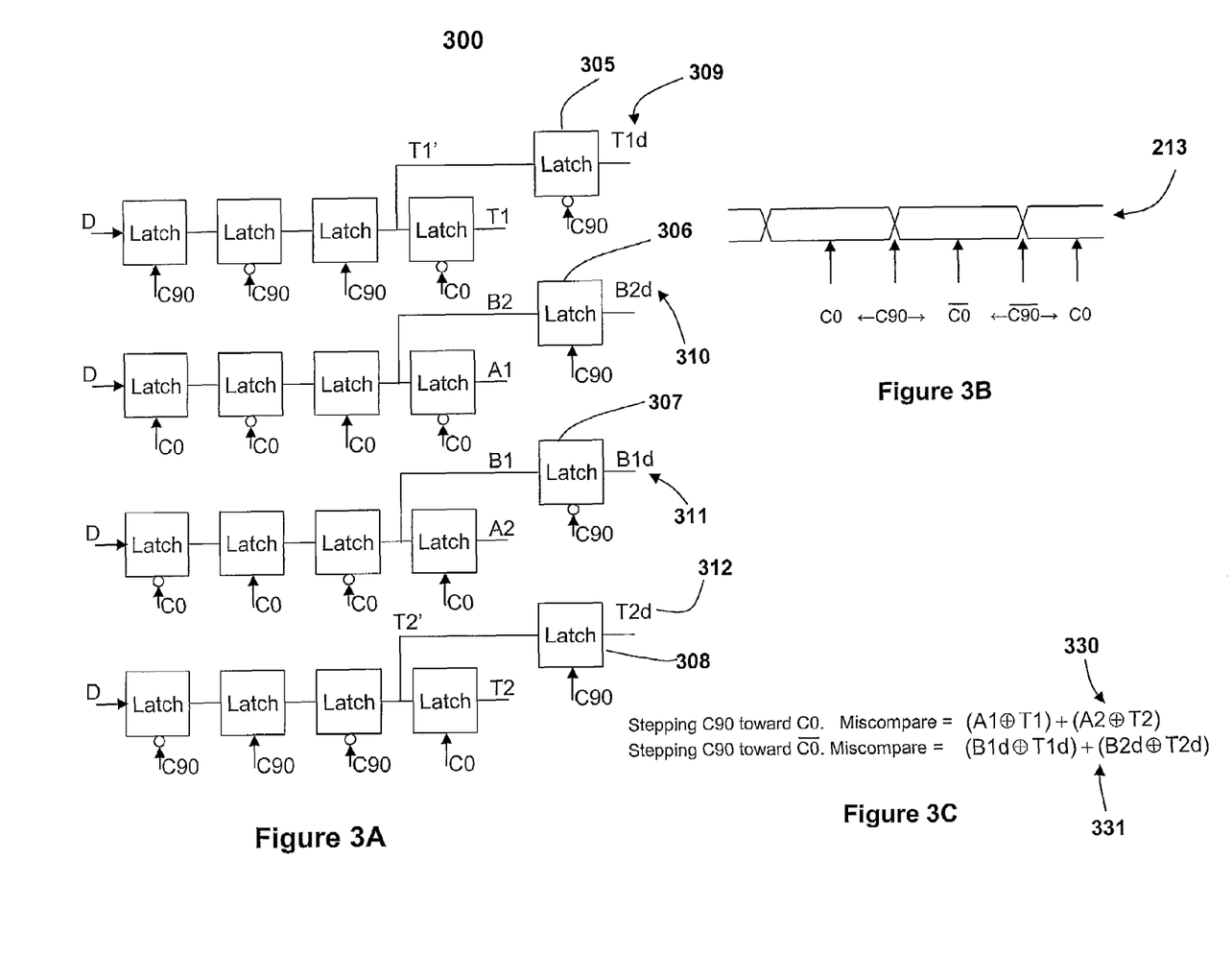
FIG. 3A illustrates a block diagram of an enhanced classical half-rate clock receiver front end, according to an illustrative embodiment.
FIG. 3B illustrates the relative phase placement of the edge clock to the data sampling clock and the alignment of these clocks with a data sequence, according to an illustrated embodiment.
FIG. 3C shows the miscompare equations which are implemented in the receiver circuitry and used to evaluate BER, according to a described embodiment.

Referring now to FIG. 3A, an implementation of an enhanced classical half-rate clock receiver front end is illustrated. An enhancement to (classical) Receiver Front End 200 has produced Enhanced Receiver Front End 300. In addition to the circuitry, features and signals of Receiver Front End 200, Enhanced Receiver Front End 300 includes first latch 305, second latch 306, third latch 307, and fourth latch 308. Enhanced Receiver Front End 300 also includes logic circuitry for computing/generating miscompares, which circuitry comprises two (2) XOR gates and two (2) OR gates. The logic functions of these XOR and OR gates are illustrated by the boolean equations shown in FIG. 3C. As further shown in FIG. 3A, Enhanced Receiver Front End 300 generates data sequence-T1d 309, data sequence-B2d 310, data sequence-B1d 311, and data sequence-T2d 312, as respective outputs from corresponding first through fourth latches (305-308).

As a result of the above enhancements, Enhanced Receiver Front End 300, has improved screening ability for measuring the horizontal eye opening. Specifically, the enhancement of Enhanced Receiver Front End 300 provides for a phase shifting (relative to the C0 clock) of the C90 clock to the left (FIG. 5A) and to the right (FIG. 4A) from the locked position, in order to screen the data eye diagram (FIG. 6A, FIG. 6B). This C90 adjustment (right and left) about the eye diagram is executed while maintaining the C0 clock sampling in the middle of data symbols 213. During the eye screening, the C90 data sample is compared to the C0 data sample (the error free functional data). In particular, Enhanced Receiver Front End 300 evaluates miscompares according to the equations shown by FIG. 3C, namely (1) left screening miscompare 330 and (2) right screening miscompare 331. These equations, left screening miscompare 330 and right screening miscompare 331 provide a count of how many bits are in error when the eye pattern is screened from the left and from the right, respectively. Consequently, Enhanced Receiver Front End 300 provides for the computation of a Bit Error Rate (BER) value, in which the position of C90 relative to C0 determines the horizontal eye opening (or margin) for the computed BER.

Further analysis of the miscompare equations reveals the reason for the chosen path (in FIG. 3A) and the associated individual inputs and terms of each miscompare equation. The miscompare equations aim to compare an error free (C0 sampled) sequence (by utilizing XOR logic) with a sequence for which there exists probable uncertainty. In Enhanced Receiver Front End 300, the data samples represent the error free sequence while the edge samples represent the sequence with probable uncertainty.

In an alternate embodiment, Enhanced Receiver Front End 300 may limit the eye screening procedure of Enhanced Receiver Front End 300 to every two eye patterns only. In this implementation, the enhancement to the receiver circuitry may only need two (2) additional latches and one (1) XOR gate. In yet another alternate embodiment, Enhanced Receiver Front End 300 may assume adequate eye symmetry and limit the screening procedure of Enhanced Receiver Front End 300 to half of the eye pattern only. In this embodiment, no additional logic overhead is required.

Figure 4A:
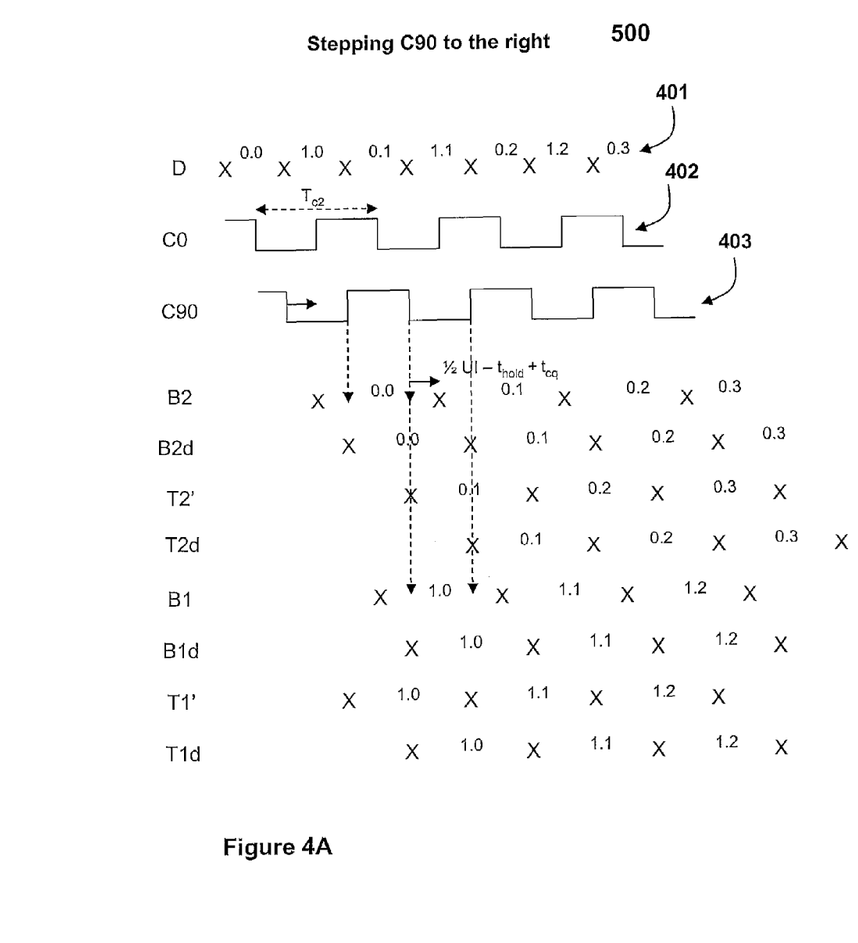
FIG. 4A illustrates the horizontal eye screening method through a set of timing diagrams in which the eye pattern is screened towards the right, according to an illustrative embodiment.
Figure 4B:
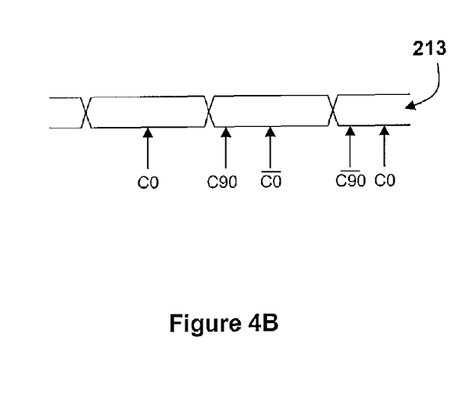
FIG. 4B illustrates the relative phase placement of the edge clock to the data sampling clock and the alignment of these clocks with the data sequence during right horizontal screening, according to an illustrative embodiment.

FIG. 4A illustrates the horizontal eye screening method by using a set of timing diagrams in which the eye pattern is screened towards the right as C90 steps towards $\overline{C0}$, the complement of C0. FIG. 4A comprises data input timing diagram 401 for the input data sequence, C0 timing diagram 402 for the C0 clock, C90 timing diagram 403 for the C90 clock. FIG. 4A also comprises other timing diagrams for various data sequences generated during the left eye pattern screening. FIG. 4B illustrates the relative phase placement of C90 to C0 and the alignment of these clocks with data symbols/sequence 213. In FIG. 4B, (the edges of) C0 is aligned in the middle of data symbols 213 and (the edges of) C90 has moved towards $\overline{0}$ and away from C0.

Figure 5A:
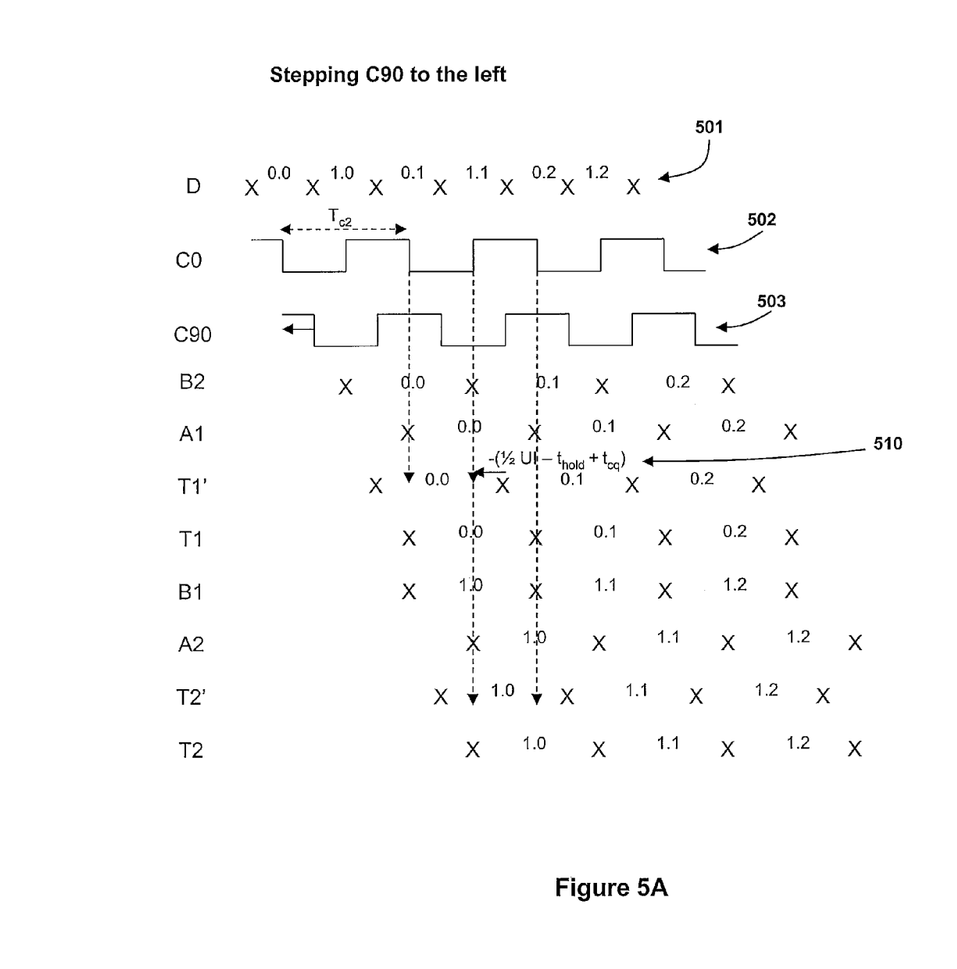
FIG. 5A illustrates the horizontal eye screening method by displaying a set of timing diagrams in which the eye pattern is screened towards the left, according to an illustrative embodiment.
Figure 6A:
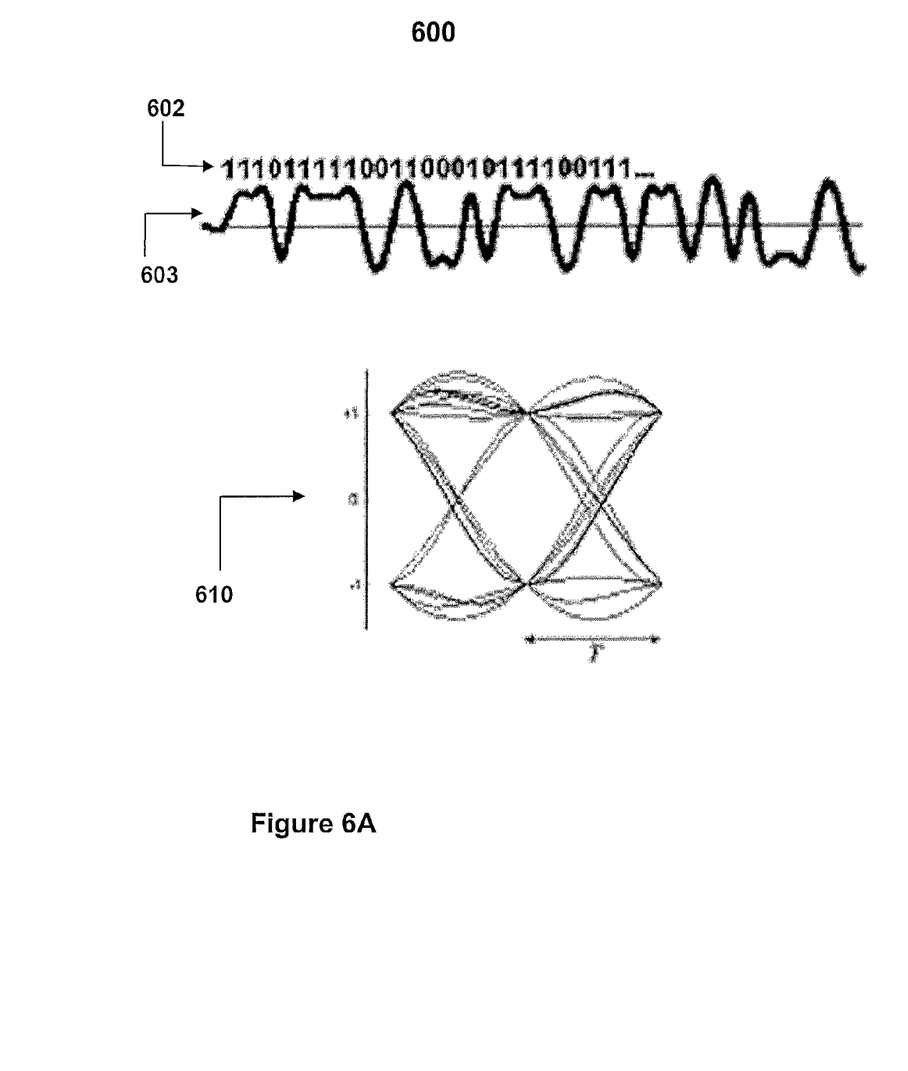
FIG. 6A is a waveform illustrating an eye pattern formation.
Figure 6B:
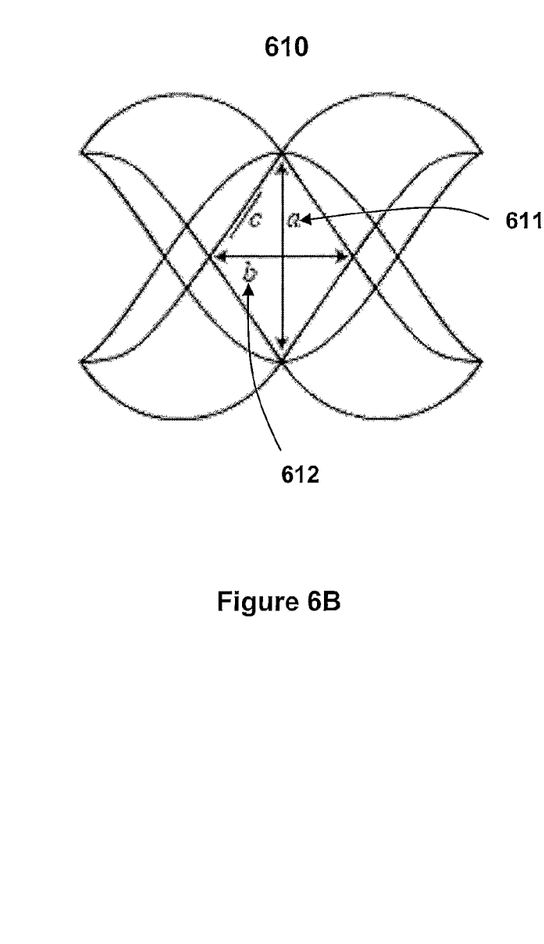
FIG. 6B is a waveform illustrating an eye pattern and the parameters of the eye pattern.

Similar to the method illustrated in FIG. 4A, FIG. 5A illustrates the horizontal eye screening method through a set of timing diagrams in which the eye pattern is screened towards the left as C90 is stepped towards C0. FIG. 5A comprises data input timing diagram 501 for the input data sequence, C0 timing diagram 502 for the C0 clock, C90 timing diagram 503 for the C90 clock. FIG. 5A also comprises other timing diagrams for various data sequences generated during the left eye pattern screening.

Figure 5B:
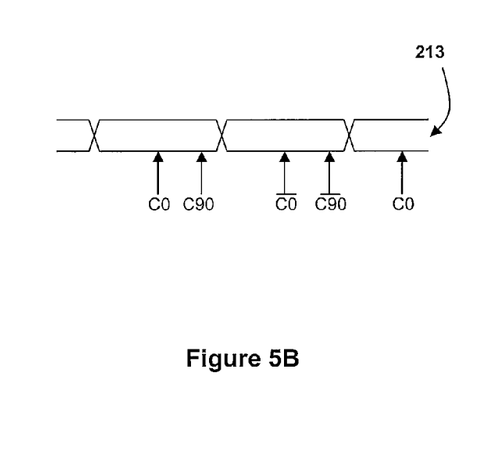
FIG. 5B illustrates the relative phase placement of the edge clock to the data sampling clock and the alignment of these clocks with the data sequence during left horizontal screening, according to an illustrative embodiment.

The eye screening range is indicated in FIG. 5A as eye range 510. In eye range 510, UI refers to the unit interval, which is defined as the minimum time interval between condition changes of a data transmission signal, $t_{hold}$ refers to the minimum time after the clocking event during which the input (to the latch) must remain stable, and $t_{cq}$ is the propagation delay (of the latch). FIG. 5B illustrates the relative phase placement of C90 to C0 and the alignment of these clocks with data symbols/sequence 213. In FIG. 5B, (the edges of) C0 is aligned in the middle of data symbols 213 and (the edges of) C90 has moved towards C0.

The timing diagrams illustrated in FIG. 4A, FIG. 4B, FIG. 5A and FIG. 5B indicate shifts in edge clock placement and the resulting generated timing waveforms. The timing diagrams illustrated in FIG. 4A, FIG. 4B, FIG. 5A and FIG. 5B are readily understood by one skilled in the art.

Turning now to FIG. 6A, two waveforms of an eye pattern formation is illustrated. Eye formation 600 comprises bit sequence 602, waveform 603 and eye diagram/pattern 610. Eye diagram 610 consists of many synchronized, overlaid traces of small sections (representing a few symbols) of waveform 603. The symbols are assumed to be random and independent, so all the possible symbol combinations are expected to have occurred.

FIG. 6B illustrates eye pattern 610 and the parameters of eye pattern 610. Specifically, eye pattern 610 shows vertical eye opening (a) 611 and horizontal eye opening (b) 612. Features of the eye pattern 610 are defined as follows: (1) Vertical Eye opening (a) 611 (height, peak to peak), measure of the additive noise in the signal; (2) Eye overshoot/undershoot, measure of the peak distortion; and (3) Horizontal Eye opening (b) 612, measure of timing synchronization & jitter effects.

The smaller the horizontal eye opening (b) 612, the greater the sensitivity to errors in timing phase. The wider the vertical eye opening (a) 611, the greater the noise immunity. In eye pattern 610, the ideal sampling instant is at the point of maximum vertical eye opening. However, Intersymbol Interference (ISI) will reduce vertical eye opening (a) 611. Intersymbol Interference is a distortion of the received signal, in which the distortion is manifested in the temporal spreading and consequent overlap of individual pulses to the degree that the receiver cannot reliably distinguish between changes of state, i.e., between individual signal elements. At a certain threshold, Intersymbol Interference compromises the integrity of the received data.

Figure 7:
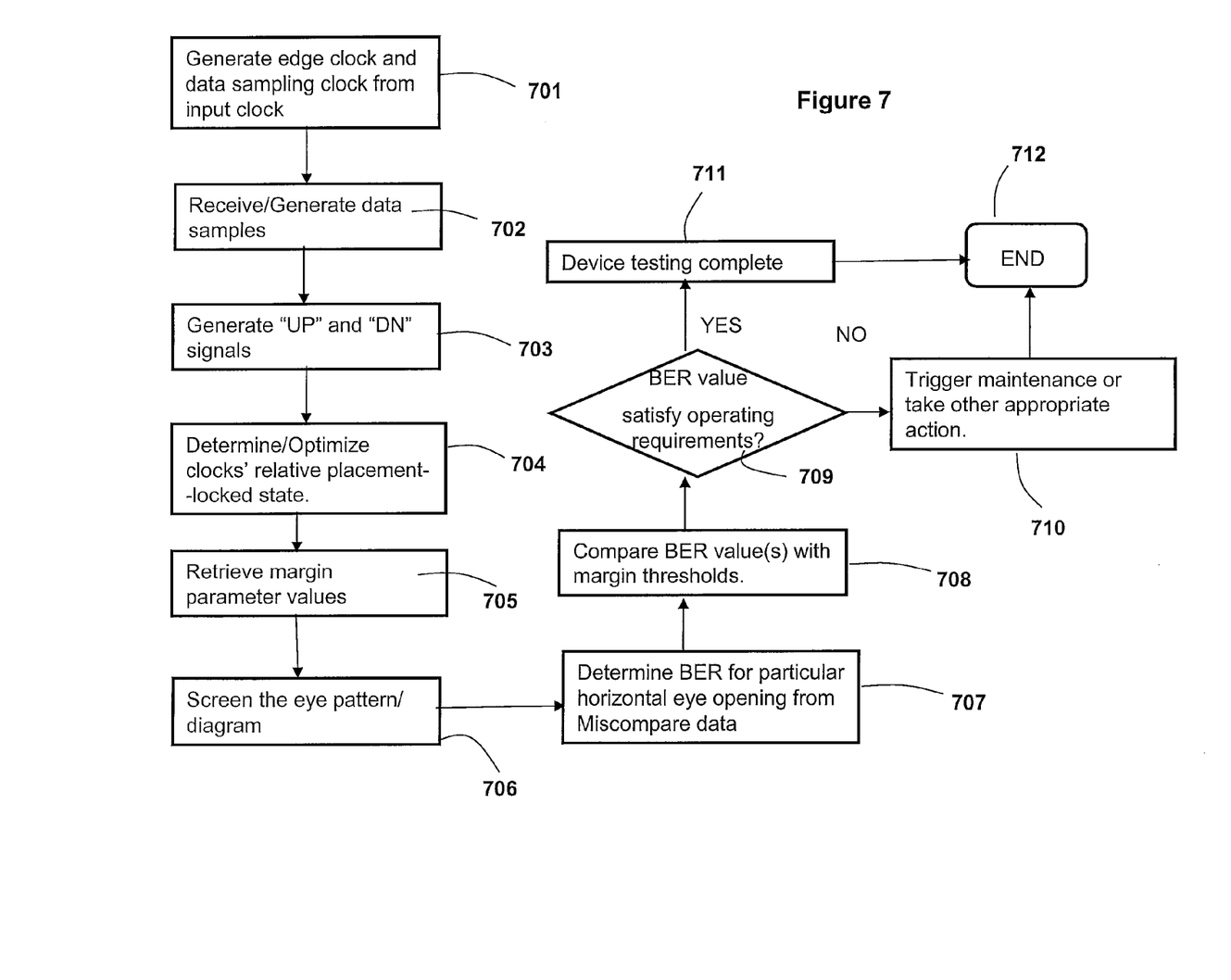
FIG. 7 illustrates the process completed by the Enhanced Classical Receiver method, according to the illustrative embodiment.

FIG. 7 illustrates the process completed by the Enhanced Classical Receiver method, according to the illustrative embodiment. The process begins at block 701, at which the receiver circuitry generates an edge sampling clock and a data sampling clock from an input clock. At block 702, edge samples and data samples are generated by the receiver circuitry (FIG. 1). The enhanced classical receiver then generates the "UP" and "DN" signals, as shown at block 703. These signals are used (usually after some filtering has been applied to the UP and DN signals) to optimally adjust the phase delay of the edge clock (C90) such that the edges of C90 coincide with the data edges indicating the locked position/state, as shown at block 704.

At block 705, the receiver retrieves/accesses the margin requirement values from data currently being entered or (preset) data previously loaded into the device. Guided by the margin values, the eye pattern screening process begins, as shown at block 706. These margin values, which indicate the acceptable limit(s) of a device's operating requirements, are utilized to specifically offset the edge sample placement from the data samples in the positive and negative phase direction with a phase magnitude indicated by the margin value. At block 707, miscompare data (or miscompares) provided by the Boolean logic circuitry within the receiver is used to compute the BER for the specific margins. Miscompares are based on left screening miscompare 330 and right screening miscompare 331 (FIG. 3C). BER is the percentage of bits that have errors, i.e., the number of miscompares, relative to the total number of bits received in a transmission. The process of determining miscompares is ideally carried out for an appropriate time interval or bit duration, which may depend on bandwidth requirements. The receiver may also measure miscompares for a wide and narrow margin, for example, at ±20% and ±15% eye opening, respectively.

After computing the BER, at block 708, a comparison is made between the computed BER and threshold operating requirements to determine whether BER satisfies the device's operating requirements. At block 709, the results of the comparison between the computed BER and the operating requirements are determined. If the BER requirements are satisfied, the device testing is complete, as shown at block 711. Alternatively, the positions of the C90 clock where the BER meet the expected value or is best satisfied may be used to optimally set the position of the data sampling clock. However, if the BER requirements are not satisfied, the data/information which indicated a failure may be stored and/or used to trigger a system flag indicating maintenance or replacement may be needed, as shown at block 710. The process then ends at block 712. If the device was tested both at a wide margin and a narrow margin and BER requirements were satisfied at one margin and failed at the other margin, the link may be optionally declared as marginal rather than as a failure. The screening process may also be executed periodically so that the results of the screening process may be used to make adjustments to the receiver device or associated links. Some of these receiver adjustments during diagnostics and/or during real time or live traffic detection may include increasing or decreasing data rates, moving clock edges, and changing power levels. These adjustments are made in order to improve data integrity, thereby reducing the BER.

In the flow chart (FIG. 7) above, while the process steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

Other methods for determining eye pattern margins involve counting the data transitions. The computation of miscompares (which provides a sufficient transition density) provides a complete and accurate approach to determining margins and calculating BER. However, in an alternate embodiment, a transition counter may be used (with an associated confidence level) to perform left and right eye pattern margining if this alternate method is desired.

With a minimal associated cost of implementation, an enhancement to a typical receiver system allows the receiver system to efficiently measure the horizontal eye opening by executing an on-chip diagnostic while testing or during real time and/or live traffic detection.

While the invention has been particularly shown and described with reference to a preferred embodiment, it will be understood by those skilled in the art that various changes in form and detail may be made therein without departing from the spirit and scope of the invention. For example, while the invention is described as applied to half-rate clock receivers (i.e., receivers in which the receiver clock frequency is equal to half the symbol rate), the features of the invention are applicable to any sub-rate clock receivers. For example, the invention may be implemented with quarter-rate clock receivers, where the clock frequency is equal to a quarter of the symbol rate. As another example, the invention may also be applied to a full-rate clock receiver, wherein the receiver clock frequency is equal to the symbol rate.

What is claimed is:

1. A receiver comprising:
   a receiver front end circuitry having one or more data paths at which input data is received and from which one or more sampled outputs are generated;
   a data sampling clock and an edge sampling clock that are applied to devices within the data paths to generate data clock samples and edge clock samples from the input data, respectively;
   one or more secondary latches, each coupled to a data path among the one or more data paths and which receives an input from the edge sampling clock to generate a secondary edge sample; and logic for computing a bit error rate (BER) of the receiver utilizing the secondary edge samples generated at the one or more secondary latches, wherein said logic for computing comprises:
   a first set of at least one XOR gate, which receives as inputs the secondary edge samples generated at the one or more secondary latches; and
   a second set of at least one XOR gate, which receives as inputs the one or more sampled outputs.

2. The receiver of claim 1, wherein:
said one or more data paths comprises four data paths; and
said one or more secondary latches includes four secondary latches, each corresponding to a respective data path, and which each generates a specific secondary edge samples, wherein each of the four secondary edge samples are provided as inputs to the logic for computing the BER.

3. A receiver comprising:
a receiver front end circuitry having one or more data paths at which input data is received and from which one or more sampled outputs are generated;
a data sampling clock and an edge sampling clock that are applied to devices within the data paths to generate data clock samples and edge clock samples from the input data, respectively;
one or more secondary latches, each coupled to a data path among the one or more data paths and which receives an input from the edge sampling clock to generate a secondary edge sample; and
logic for computing a bit error rate (BER) of the receiver utilizing the secondary edge samples generated at the one or more secondary latches;
wherein said logic for computing a BER comprises
logic for phase shifting the edge sampling clock, relative to the data sampling clock, in a first direction and a second direction away from a locked state to screen a data eye diagram, wherein said phase shifting the edge sampling clock is completed while maintaining the sampling of the data sampling clock in the middle of an input data pulse signal.

4. The receiver of claim 3, wherein:
said logic for phase shifting the edge sampling lock comprises:
   logic for enabling a phase shifting of the edge sampling clock, relative to the data sampling clock, from the locked position, in order to screen a data eye diagram, while maintaining the data sampling clock in the middle of an input data; and
   logic for comparing the secondary edge clock sample to the data clock sample to generate a count of how many bits are in error when an eye pattern is screened from a positive and a negative phase shifted position; and
said logic for computing comprises logic for computing the BER as a value in which the position of the edge clock relative to the data clock determines a horizontal eye opening (margin) for the BER computed.

5. A receiver comprising:
a receiver front end circuitry having one or more data paths at which input data is received and from which one or more sampled outputs are generated;
a data sampling clock and an edge sampling clock that are applied to devices within the data paths to generate data clock samples and edge clock samples from the input data, respectively;
one or more secondary latches, each coupled to a data path among the one or more data paths and which receives an input from the edge sampling clock to generate a secondary edge sample; and
logic for computing a bit error rate (BER) of the receiver utilizing the secondary edge samples generated at the one or more secondary latches;
wherein said logic for computing further comprises means for completing an eye pattern screening process, utilizing pre-set margin values that indicate acceptable limit(s) of the receiver's operating requirements and said pre-set margin values are utilized to specifically offset an edge sample placement from the data samples in a positive and a negative phase direction with a phase magnitude indicated by the margin values.

6. The receiver of claim 5, wherein:
when said means for completing the eye screening process limits the eye screening procedure to every two eye patterns only, the receiver circuitry utilizes only two secondary latches and one XOR gate as said logic; and
when said means for completing eye screening limits the screening procedure to half of the eye pattern only, the one or more secondary latches are not utilized within the receiver.

7. The receiver of claim 1, wherein said receiver is a clock receiver from among:
an enhanced classical half-rate clock receiver, which receiver has a first receiver clock frequency that is equal to a half of a symbol rate;
a quarter-rate clock receiver, which has a second receiver clock frequency equal to a quarter of the symbol rate; and
a full-rate clock receiver, which has a third clock frequency equal to the symbol rate.

8. An electronic device comprising:
a front end receiver circuit, which receives a data input and which generates one or more primary data outputs;
one or more secondary latches, each connected in parallel to a primary data output among the one or more primary outputs, and which respectively generates one or more secondary outputs;
a data sampling clock and an edge sampling clock that are each individually applied to specific devices within the front end receiver, wherein the edge sampling clock is also applied to each of the one or more secondary latches, wherein the input data is sampled at one of the rising and falling edges of an edge sampling clock that is characterized by a phase delay relative to the data sampling clock;
means for generating the data sampling clock and edge sampling clock, wherein the edge sampling clock is phase shifted a pre-set number of degrees relative to the data sampling clock input; and
logic for determining a bit error rate (BER) of the receiver circuit using a combination of the one or more primary outputs and the one or more secondary outputs.

9. An electronic device comprising:
a front end receiver circuit, which receives a data input and which generates one or more primary data outputs;
one or more secondary latches, each connected in parallel to a primary data output among the one or more primary outputs, and which respectively generates one or more secondary outputs;
a data sampling clock and an edge sampling clock that are each individually applied to specific devices within the front end receiver, wherein the edge sampling clock is also applied to each of the one or more secondary latches, wherein the input data is sampled at one of the rising and falling edges of an edge sampling clock that is characterized by a phase delay relative to the data sampling clock; and logic for determining a bit error rate (BER) of the receiver circuit using a combination of the one or more primary outputs and the one or more secondary outputs;

wherein said logic for determining a BER comprises:

means for generating the data sampling clock and edge sampling clock, wherein the edge sampling clock is phase shifted a pre-set number of degrees relative to the data sampling clock input;

wherein application of the data sampling clock and edge sampling clock results in the generation at the receiver circuit of data clock samples and edge clock samples, wherein a phase relation between the data sampling clock and the edge sampling clock is set, such that edges of the data sampling clock are aligned in the middle of the input data;

logic for determining a first miscompare when the edge sampling clock input is stepped towards the data sampling clock; and logic for determining a second miscompare when the edge sampling clock is stepped away from the data sampling clock and towards a previous pulse of the data sampling clock.

10. The electronic device of claim 9, wherein said logic for determining a BER comprises:

logic for processing the data sampling clock and edge sampling clock utilizing Boolean logic to generate an "UP" signal and a "DN" signal, wherein said UP and said DN signals are used to optimally adjust the phase delay of the edge sampling clock, such that the edges of the edge sampling clock coincide with the data edges indicating the locked position/state;

logic for adjusting the a phase delay of the edge sampling clock utilizing the UP signal and the DN signal, whereby edges of the edge sampling clock coincide with data edges of an input data pulse signal, wherein an alignment of the edge sampling clock (pulse edges) with the data edges indicates a locked state; and logic for phase shifting the edge sampling clock, relative to the data sampling clock, in a first direction and a second direction away from the locked state to screen a data eye diagram, wherein said phase shifting the edge sampling clock is completed while maintaining the sampling of the data sampling clock in the middle of an input data pulse signal.

11. The electronic device of claim 10, further comprising:

logic for comparing a data sample of the edge sampling clock to a next data sample of the data sampling clock to compute the BER, wherein a phase position of the edge sampling clock relative to the data sampling clock determines a horizontal eye opening/margin for the BER computed.

12. An electronic device comprising:

a front end receiver circuit, which receives a data input and which generates one or more primary data outputs;

one or more secondary latches, each connected in parallel to a primary data output among the one or more primary outputs, and which respectively generates one or more secondary outputs;

a data sampling clock and an edge sampling clock that are each individually applied to specific devices within the front end receiver, wherein the edge sampling clock is also applied to each of the one or more secondary latches, wherein the input data is sampled at one of the rising and falling edges of an edge sampling clock that is characterized by a phase delay relative to the data sampling clock;

logic for determining a bit error rate (BER) of the receiver circuit using a combination of the one or more primary outputs and the one or more secondary outputs;

wherein said receiver circuitry comprises a plurality of sequences of serially-connected latches, each sequence having a first latch at which the data input is received and a final latch from which a primary output of the one or more primary outputs is generated; and wherein each secondary latch is connected to one sequence of the serially-connected latches at a node prior to the final latch of that one sequence, wherein the secondary latch generates a secondary output that is phase shifted relative to the primary output of that one sequence of serially-connected latches.

13. The electronic device of claim 9, wherein the secondary latches and logic for computing the BER enables a determination of margin parameters of the receiver system during diagnostic self checking and during real time and/or live data detection.

14. The electronic device of claim 9, wherein the receiver circuitry and one or more secondary latches connected thereto provide a clock receiver from among:

an enhanced classical half-rate clock receiver, which receiver has a first receiver clock frequency that is equal to a half of a symbol rate;

a quarter-rate clock receiver, which has a second receiver clock frequency equal to a quarter of the symbol rate; and a full-rate clock receiver, which has a third clock frequency equal to the symbol rate.

15. A method for determining the margin parameters of a receiver, said method comprising:

generating, at the receiver, edge clock samples and data clock samples utilizing an edge sampling clock and a data sampling clock;

generating an "UP" signal and a "DN" signal, wherein said UP and said DN signals are used to optimally adjust the phase delay of the edge sampling clock, such that the edges of the edge sampling clock coincide with the data edges indicating the locked position/state;

retrieving values corresponding to margin requirements from one of: (a) data currently being entered and (b) preset data previously loaded into the receiver device;

wherein the margin pre-defines acceptable limit(s) of the receiver's operating requirements and are utilized to specifically offset an edge sample placement from the data clock samples in a positive and a negative phase direction with a phase magnitude indicated by the retrieved margin values;

initiating an eye pattern screening process, utilizing the margin values;

determining miscompare data (miscompares) via a boolean logic circuitry within the receiver; and computing a bit error rate (BER) for the specific margin values, said BER representing a percentage of bits that have errors, based on the number of miscompares, relative to a total number of bits received in a transmission.

16. A method for determining the margin parameters of a receiver, said method comprising:

generating, at the receiver, edge clock samples and data clock samples utilizing an edge sampling clock and a data sampling clock;

generating an "UP" signal and a "DN" signal, wherein said UP and said DN signals are used to optimally adjust the phase delay of the edge sampling clock, such that the edges of the edge sampling clock coincide with the data edges indicating the locked position/state;

retrieving values corresponding to margin requirements from one of: (a) data currently being entered and (b) preset data previously loaded into the receiver device;

wherein the margin pre-defines acceptable limit(s) of the receiver's operating requirements and are utilized to specifically offset an edge sample placement from the data clock samples in a positive and a negative phase direction with a phase magnitude indicated by the retrieved margin values;

initiating an eye pattern screening process, utilizing the margin values;

comparing the BER computed and a threshold operating requirement of the receiver to determine whether the BER satisfies the receiver's threshold operating requirements;

when the BER satisfies the threshold operating requirements, setting a current position of the edge sampling clock at which the BER meets the threshold operating requirements to optimally set the position of the data sampling clock; and when the BER does not satisfy the threshold operating requirements, storing data which indicates a failure and triggering a system flag indicating that maintenance of the receiver is required.

17. A method for determining the margin parameters of a receiver, said method comprising:

generating, at the receiver, edge clock samples and data clock samples utilizing an edge sampling clock and a data sampling clock;

generating an "UP" signal and a "DN" signal, wherein said UP and said DN signals are used to optimally adjust the phase delay of the edge sampling clock, such that the edges of the edge sampling clock coincide with the data edges indicating the locked position/state;

retrieving values corresponding to margin requirements from one of: (a) data currently being entered and (b) preset data previously loaded into the receiver device;

wherein the margin pre-defines acceptable limit(s) of the receiver's operating requirements and are utilized to specifically offset an edge sample placement from the data clock samples in a positive and a negative phase direction with a phase magnitude indicated by the retrieved margin values;

initiating an eye pattern screening process, utilizing the margin values;

periodically performing an automatic screening process and utilizing the results of the screening process to make adjustments to the receiver device or associated links to reduce the BER and improve data integrity, said adjustments including: increasing or decreasing data rates, moving clock edges, and changing power levels; and wherein the receiver system efficiently measures the horizontal eye opening by executing an on-chip diagnostic while testing and during real time and live traffic detection.

18. A method for determining the margin parameters of a receiver, said method comprising:

generating, at the receiver, edge clock samples and data clock samples utilizing an edge sampling clock and a data sampling clock;

generating an "UP" signal and a "DN" signal, wherein said UP and said DN signals are used to optimally adjust the phase delay of the edge sampling clock, such that the edges of the edge sampling clock coincide with the data edges indicating the locked position/state;

retrieving values corresponding to margin requirements from one of: (a) data currently being entered and (b) preset data previously loaded into the receiver device;

wherein the margin pre-defines acceptable limit(s) of the receiver's operating requirements and are utilized to specifically offset an edge sample placement from the data clock samples in a positive and a negative phase direction with a phase magnitude indicated by the retrieved margin values;

initiating an eye pattern screening process, utilizing the margin values;

determining eye pattern margins by counting data transitions utilizing a transition counter to perform left and right eye pattern margining.

19. A receiver comprising:

a receiver front end circuitry having one or more data paths at which input data is received and from which one or more sampled outputs are generated;

a data sampling clock and an edge sampling clock that are applied to devices within the data paths to generate data clock samples and edge clock samples from the input data, respectively;

one or more secondary latches, each coupled to a data path among the one or more data paths and which receives an input from the edge sampling clock to generate a secondary edge sample; and logic for computing a bit error rate (BER) of the receiver utilizing the secondary edge samples generated at the one or more secondary latches;

wherein said logic for computing a BER includes logic for processing the data sampling clock and edge sampling clock utilizing Boolean logic to generate an "UP" signal and a signal, wherein said UP and said DN signals are used to optimally adjust the phase delay of the edge sampling clock, such that the edges of the edge sampling clock coincide with the data edges indicating the locked position/state.

20. The receiver of claim 19, further comprising:

logic for adjusting the a phase delay of the edge sampling clock utilizing the UP signal and the DN signal, whereby edges of the edge sampling clock coincide with data edges of an input data pulse signal, wherein an alignment of the edge sampling clock (pulse edges) with the data edges indicates a locked state.

* * * * *